United States Patent
Radhakrishnan (10) Patent No.: US 8,952,480 B2
(45) Date of Patent: Feb. 10, 2015

(54) ELECTRONIC DEVICE INCLUDING THERMAL SENSOR AND PELTIER COOLER AND RELATED METHODS

(75) Inventor: PraveenKumar Radhakrishnan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 1 day.

(21) Appl. No.: 13/614,008

(22) Filed: Sep. 13, 2012

(65) Prior Publication Data

US 2014/0070355 A1   Mar. 13, 2014

(51) Int. Cl.

| | |
|---|---|
| H01L 31/058 | (2006.01) |
| H01L 23/34 | (2006.01) |
| H01L 21/00 | (2006.01) |
| H01L 35/32 | (2006.01) |
| H01L 35/28 | (2006.01) |
| H01L 23/38 | (2006.01) |

(52) U.S. Cl.
CPC ............... H01L 35/32 (2013.01); H01L 35/28 (2013.01); H01L 23/38 (2013.01); *Y10S 257/93* (2013.01)
USPC ........... 257/467; 257/930; 257/468; 257/712; 257/E23.082; 438/54

(58) Field of Classification Search
CPC ......... H01L 35/32; H01L 35/28; H01L 31/24; H01L 23/38; G01J 5/16
USPC .................. 257/467, 468, 712, 930, E23.082, 257/E23.018; 136/203, 204, 224; 250/352; 65/3.2; 438/54
See application file for complete search history.

(56) References Cited

U.S. PATENT DOCUMENTS

| | | | |
|---|---|---|---|
| 5,064,476 A | 11/1991 | Recine, Sr. | |
| 5,156,004 A * | 10/1992 | Wu et al. | 62/3.1 |
| 5,714,791 A * | 2/1998 | Chi et al. | 257/467 |
| 6,787,387 B2 | 9/2004 | Ikushima et al. | |
| 7,491,938 B2 | 2/2009 | Geneczko et al. | |
| 7,619,158 B2 | 11/2009 | Sharp et al. | |
| 7,626,114 B2 | 12/2009 | Stark | |
| 7,768,048 B2 | 8/2010 | Ueno et al. | |
| 2004/0208345 A1 * | 10/2004 | Chou et al. | 382/124 |
| 2006/0169902 A1 * | 8/2006 | Watanabe | 250/338.1 |
| 2008/0171249 A1 | 7/2008 | Arana et al. | |

OTHER PUBLICATIONS

Goncalves et al., A miniaturized self-calibrated pyrometer microsystem, 2003, pp. 568-569.
Wijngaards et al., Design and fabrication of on-chip integrated polySiGe and polySi Peltier devices, 1999, pp. 316-323.
Tellurex, Frequently Ased Questions About Our Cooling and Heating Technology, 2010, pp. 1-20.

* cited by examiner

*Primary Examiner* — Fernando L Toledo
*Assistant Examiner* — Aaron Gray
(74) *Attorney, Agent, or Firm* — Allen, Dyer, Doppelt, Milbrath & Gilchrist, P.A.

(57) ABSTRACT

An electronic device may include a temperature sensing semiconductor substrate, that may include a thermal sensor at an upper surface thereof, and a cooling semiconductor substrate having an upper surface coupled to a lower surface of the temperature sensing semiconductor substrate. The cooling semiconductor substrate may include a Peltier cooler. At least one of the temperature sensing semiconductor substrate and the cooling semiconductor substrate may have a cavity therein beneath the thermopile and aligned therewith.

25 Claims, 12 Drawing Sheets

ELECTRONIC DEVICE INCLUDING THERMAL SENSOR AND PELTIER COOLER AND RELATED METHODS

FIELD OF THE INVENTION

The present invention relates to the field of electronics, and, more particularly, to the field of thermoelectric devices.

BACKGROUND OF THE INVENTION

An infrared (IR) sensor may have many applications. For example, an IR sensor may be used for automatic lighting control, intrusion detection, and thermal imaging for medical, security, and automotive purposes. There has been a trend of moving away from 'cooled' IR sensors towards 'uncooled' approaches, primarily for cost effectiveness, and improving the versatility and robustness of the sensor, however trading off some performance parameters.

One approach to passive infrared detection is a pyroelectric detector, for example. A pyroelectric detector is typically constructed from lead zirconate titanate (PZT) using a sol-gel deposition method. While a pyroelectric detector may have relatively good sensitivity (V/W) to infrared radiation, it has several performance shortcomings. In particular, a pyroelectric detector typically requires constant motion, has Z-directional insensitivity, is prone to false alarms, and may have a relatively low response time. Moreover, a pyroelectric detector may be relatively expensive.

Another approach to passive infrared detection is a microbolometer. A microbolometer is used particularly for thermal imaging applications due to cooling requirements. Current cooling approaches are generally implemented using a cryogenic system, for example, which make an IR sensor relatively bulky and less robust. While an un-cooled version of a microbolometer exists, which is cheaper than its cooled counterpart, it has still not found entry into the commercial market because of its relative fabrication complexity.

One cost-effective approach may be a thermopile, which, for example, can detect immobile warm bodies, has reduced Z-directional insensitivity, has lower false alarms, and a relatively quicker response. However, one major drawback comes in terms of the sensitivity which could be a little lower than half that of a pyroelectric sensor, for example. However, this parameter is a trade-off between physical device size and performance requirement based upon an end application.

One problem common to all three above-noted uncooled sensors may be noise due to self-heating. Self-heating may be caused by incident infrared rays being absorbed by the housing, current consumed by the application specific integrated circuit (ASIC), or the device elements themselves, for example.

One approach for improving sensitivity of an IR sensor involves the use of high vacuum level packaging. However, high vacuum level packaging may be problematic with respect to product lifetime. Another approach for improving sensitivity of an IR sensor involves the use of IR filters with an anti-reflective coating (ARC).

Yet another approach for improving sensitivity of an IR sensor is the use of cooling, especially for a microbolometer. In some applications, an on-board temperature sensor may also be used to improve self-heating.

U.S. Patent Application Publication No. 2008/0171249 to Arana et al. discloses a thermally efficient micromachined device. More particularly, Arana et al. discloses a micromachined device that processes at least one fluid stream and includes at least one fluid conducting tube having at least a region with wall thickness of less than 50 µm. The device optionally includes one or more thermally conductive structures in thermal communication with first and second thermally insulating portions of the fluid conducting tube. The device also may include a thermally conductive region, and at least a portion of the fluid conducting tube is disposed within the region. A plurality of structures may be provided projecting from a wall of the fluid conducting tube into an inner volume of the tube. The structures enhance thermal conduction between a fluid within the tube and a wall of the tube.

Several references disclose a Peltier cooler integrated into the same plane as thermocouples. However, this may lead to increased noise in thermocouple readout as the Peltier coolers are current consuming devices, and the heat generated may interfere with the IR signals read by the thermocouples.

Further improvements to an IR sensor may be desired. More particularly, it may be desirable to reduce self-heating, for example, at the package level, to thus increase operational and cost efficiency.

SUMMARY OF THE INVENTION

In view of the foregoing background, it is therefore an object of the present invention to provide an electronic device that has an increased sensing accuracy, and that can be fabricated in a relatively straightforward manner.

This and other objects, features, and advantages in accordance with the present invention are provided by an electronic device which may include a temperature sensing semiconductor substrate comprising a thermal sensor at an upper surface thereof, and a cooling semiconductor substrate having a upper surface coupled to a lower surface of the temperature sensing semiconductor substrate and comprising a Peltier cooler. In some embodiments the thermal sensor may be a thermopile. At least one of the temperature sensing semiconductor substrate, and the cooling semiconductor substrate may have a cavity therein beneath the thermopile and aligned therewith. Accordingly, the electronic device increases sensitivity, for example, by reducing self-heating and increasing thermal isolation from the bulk material, and, thus, may increase operational efficiency.

The electronic device may further include a dielectric layer between the temperature sensing semiconductor substrate and the cooling semiconductor substrate, for example, to reduce noise coupling to the thermopile. The temperature sensing semiconductor substrate may have the cavity therein. The cooling semiconductor substrate may, alternatively or additionally, have the cavity therein.

The Peltier cooler may include a plurality of cold semiconductor junctions, and a plurality of hot semiconductor junctions at the upper surface of the cooling semiconductor substrate, for example. The temperature sensing substrate may be carried over the plurality of cold semiconductor junctions.

The Peltier cooler may include a plurality of cold semiconductor junctions, and a plurality of hot semiconductor junctions at a lower surface of the cooling semiconductor substrate. The electronic device may further include another semiconductor substrate adjacent the lower surface of the cooling semiconductor substrate.

The Peltier cooler may include upper and lower sets of Peltier cooling elements on respective upper and lower surfaces of the cooling semiconductor substrate. A plurality of vias may extend through the cooling semiconductor substrate and couple respective ones of the upper and lower sets of Peltier cooling elements, in some embodiments.

The electronic device may further include a heat sink thermally coupled to the cooling semiconductor substrate. The electronic device may also include an infrared (IR) filter aligned with the thermal sensor. A package may surround the temperature sensing semiconductor substrate and the cooling semiconductor substrate, and may have a window opening therein receiving the IR filter, for example.

One method aspect is directed to a method of making an electronic device that may include forming a temperature sensing semiconductor substrate comprising a thermal sensor at an upper surface thereof. The method may also include forming a cooling semiconductor substrate comprising a Peltier cooler, and coupling an upper surface of the cooling semiconductor substrate to a lower surface of the temperature sensing semiconductor substrate. The method may further include forming a cavity in at least one of the temperature sensing semiconductor substrate, and the cooling semiconductor substrate beneath the thermal sensor and aligned therewith.

Another aspect is directed to an electronic device that includes a semiconductor substrate that may include a thermal sensor, and a Peltier cooler at an upper surface thereof. The Peltier cooler may include a plurality of cold semiconductor junctions adjacent the thermal sensor, and a plurality of hot semiconductor junctions. The thermal sensor may be in the form of a thermopile, for example. The electronic device may further include an infrared (IR) filter aligned with the thermal sensor, and a package over the semiconductor substrate. The package may have a window opening therein receiving the IR filter. The package also having an opening therein aligned with the plurality of hot semiconductor junctions. Accordingly, the electronic device provides increased cooling on a single substrate, which may reduce overall size of the electronic device.

The electronic device may further include a heat sink received in the opening and thermally coupled to the semiconductor substrate, for example. The electronic device may further include a dielectric layer between the semiconductor substrate and the package. The semiconductor substrate may have a cavity therein beneath the thermal sensor and aligned therewith.

A method aspect is directed to a method of making this electronic device. The method may include forming a semiconductor substrate comprising a thermal sensor, and a Peltier cooler at an upper surface thereof. The Peltier cooler may include a plurality of cold semiconductor junctions adjacent the thermal sensor, and a plurality of hot semiconductor junctions. The method may further include aligning an infrared (IR) filter with the thermal sensor. The method may also include forming a package over the semiconductor substrate and may have a window opening therein receiving the IR filter. The package may also have an opening therein aligned with the plurality of hot semiconductor junctions.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation is used to refer to like elements in different embodiments.

Figure 1:
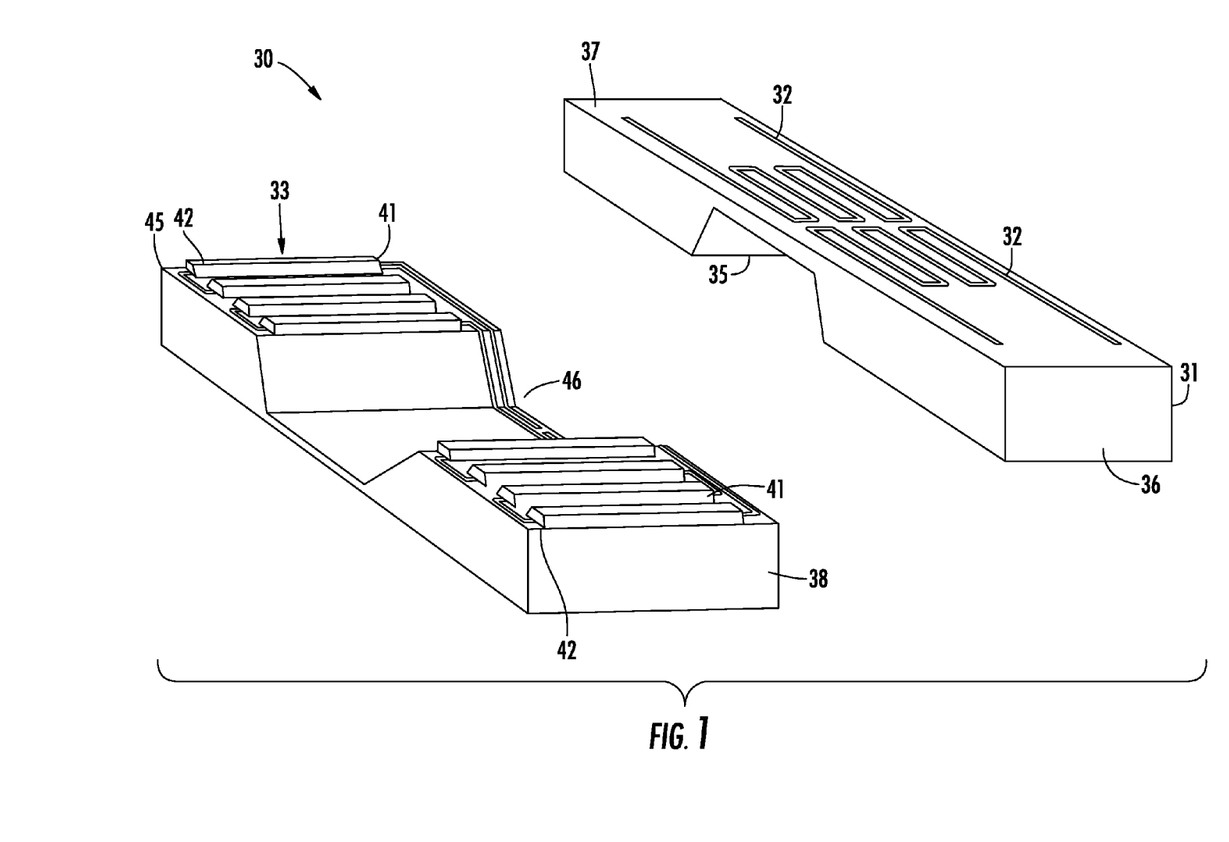
FIG. 1 is a schematic exploded view of a portion of an electronic device according to the present invention.
Figure 2:
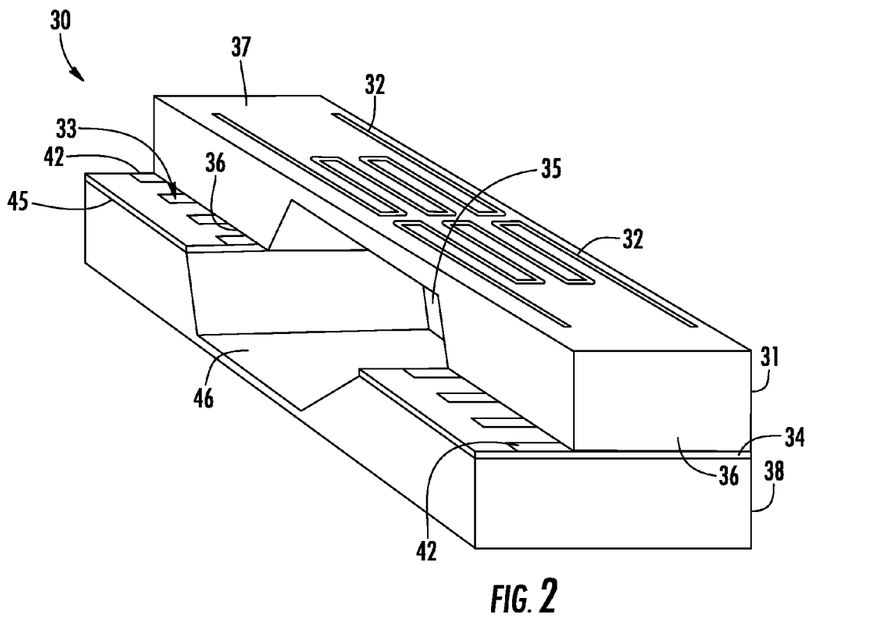
FIG. 2 is a schematic assembled view of the portion of the electronic device of FIG. 1.

Referring initially to FIGS. 1-2, an electronic device 30 includes a temperature sensing semiconductor substrate 31. The temperature sensing semiconductor substrate 31 may be a silicon substrate, for example. Of course, the temperature sensing semiconductor substrate 31 may include additional or other materials.

The temperature sensing semiconductor substrate 31 includes a thermal sensor 32 in the form of a thermopile at an upper surface 37 thereof. The thermopile 32 operates according to the Seebeck effect. According to the Seebeck effect, a current is generated when two junctions of two dissimilar materials are maintained at different temperatures. The thermopile 32 may include, in various combinations, N-type polysilicon and P-type polysilicon, poly-aluminum, polysilicon-germanium and silicon-germanium, tin and bismuth, and poly-tungsten, for example.

Generally speaking, a thermopile 32, for example, a micromachined infrared (IR) thermopile, includes junctions, either in series or in parallel, of two dissimilarly doped regions of silicon (e.g., n and p types) or doped silicon and a metal, typically aluminum, for example. One set of these junctions is the hot junction while the other is the cold junction. This array of thermocouples is thermally isolated from the bulk silicon essentially by bulk etching of a cavity beneath the hot junctions. The bulk silicon acts as a heat sink, maintaining the cold junctions at a lower temperature, as will be appreciated by those skilled in the art. The thermopile 32 may function as an IR sensor when IR (through the use of optics, such as, for example, silicon filters in tandem with anti-reflective coatings, absorber layers, etc.) affects the hot junctions. The current thus generated across the hot-cold junctions is based upon, for example, and is proportional to, the temperature difference induced by the incident IR. Moreover, as will be appreciated by those skilled in the art, in this and other embodiments, while the thermal sensor is described as being in the form of a thermopile, the thermal sensor may alternatively or additionally be in the form of a pyroelectric detector and/or a microbolometer.

The electronic device 30 also includes a cooling semiconductor substrate 38 that has an upper surface 45 coupled to a lower or bottom surface 36 of the temperature sensing semiconductor substrate 31. The cooling semiconductor substrate 38 includes a Peltier cooler 33.

More particularly, the Peltier cooler 33 is carried at the upper surface 45 of the cooling semiconductor substrate 38 and includes cold, or heat absorbing, semiconductor junctions 41, and hot, or heat desorbing, semiconductor junctions 42 at the upper surface 45 of the cooling semiconductor substrate. The cold and hot semiconductor junctions 41, 42 result from alternating P-type silicon and N-type silicon, as will be described in further detail below.

The Peltier cooler 33 operates according to the Peltier effect, where a current flowing through a circuit of two dissimilar materials produces a temperature difference (moving heat from the cold semiconductor junction 41 to the hot semiconductor junction 42). In other words, heat is extracted adjacent the cold semiconductor junctions 41 and is expelled adjacent the hot semiconductor junctions 42. The Peltier cooler 33 may include thermoelectric materials, for example, bismuth telluride, P-type polysilicon, N-type polysilicon, and polysilicon-germanium.

Generally speaking, a Peltier cooler is similar to, but different from thermocouples or a thermopile in that it depends not only on the presence of two different materials forming a circuit, but also the presence of two different charge carriers. A solid state Peltier cooler is typically constructed by forming a series connection of alternating P-type and N-type silicon. More particularly, as electrons flow in the N-type region from the negative to the positive terminals and, in the P-type region, the holes flow from the positive to the negative terminals. The current is transferred in the direction of the current flow, essentially from one surface of the substrate to another surface of the substrate carrying the Peltier cooler.

The temperature sensing semiconductor substrate 31 is carried over the cold semiconductor junctions 41. In other words, the hot semiconductor junctions 42 are exposed. This may provide further cooling by absorbing heat from the bulk silicon or of the temperature sensing semiconductor substrate 31, and conducting this heat away from the electronic device 30 toward the exposed hot semiconductor junctions 42.

A dielectric layer 34 is between the temperature sensing semiconductor substrate 31 and the cooling semiconductor substrate 38. Of course, in some embodiments, the dielectric layer 34 may not be included.

The temperature sensing semiconductor substrate 31 illustratively includes a cavity 35 therein at the bottom surface 36 thereof. The cavity 35 is beneath and aligned with the hot junctions of the thermopile 32. The cavity 35 advantageously increases thermal isolation, as will be appreciated by those skilled in the art. The cooling semiconductor substrate 38 also includes a cavity 46 therein at the top or upper surface 45 thereof. The cavity 46 is below and aligned with the cavity 35, thus being aligned with and beneath the hot junctions of the thermopile 32. The cavity 46 provides further cooling. As will be appreciated by those skilled in the art, the cavities 35, 46 may define a fluid passageway through which fluid, for example, a coolant, may be passed for additional cooling.

Figure 3:
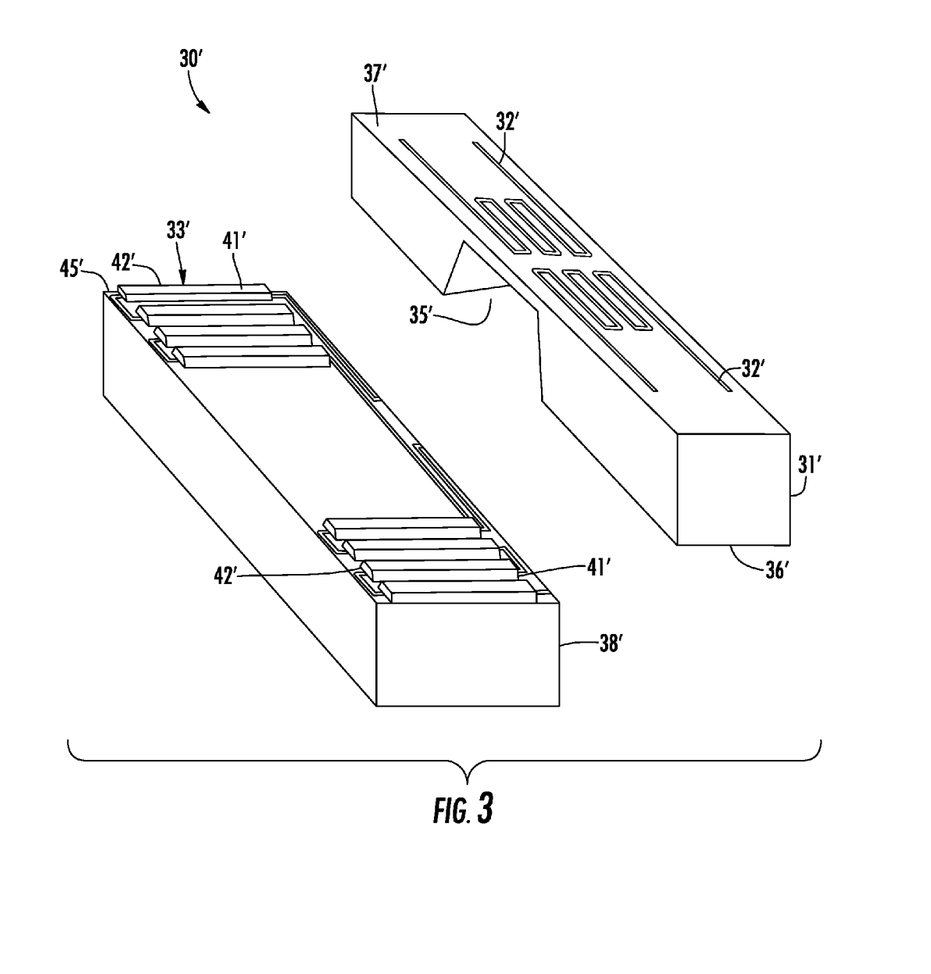
FIG. 3 is a schematic exploded view of a portion of an electronic device according to another embodiment of the present invention.

Referring now to FIG. 3, in another embodiment, the Peltier cooler 33' is carried at the upper surface 45' of the cooling semiconductor substrate 38' and includes heat absorbing or cold semiconductor junctions 41' and heat desorbing or hot semiconductor junctions 42' between the temperature sensing semiconductor substrate 31' and the cooling semiconductor substrate 38'. The temperature sensing semiconductor substrate 31', when integrated with the cooling semiconductor substrate 38', is carried over both the hot and cold semiconductor junctions 41'. Upon integration of the temperature sensing semiconductor substrate 31' and the cooling semiconductor substrate 38', a dielectric layer is introduced between the temperature sensing semiconductor substrate and the cooling semiconductor substrate. However, the junction of the Peltier cooler 33' should provide sufficient electrical insulation between the temperature sensing semiconductor substrate 31' and the cooling semiconductor substrate 38'.

Additionally, the temperature sensing semiconductor substrate 31' includes a cavity 35' therein at a bottom surface 36' thereof. The cavity 35' is beneath and aligned with the thermopile 32'. The cooling semiconductor substrate 38' does not include a cavity.

Figure 4:
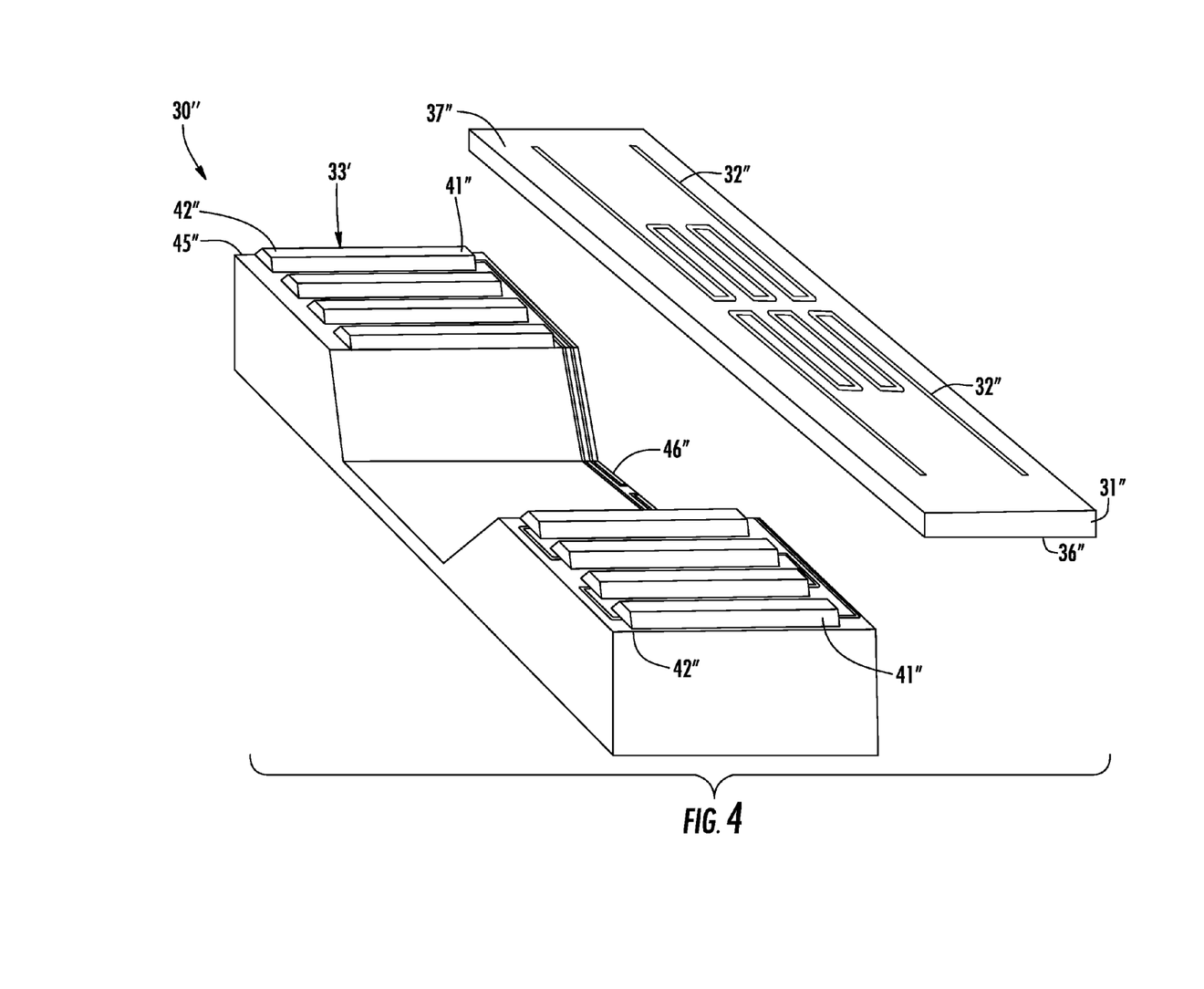
FIG. 4 is a schematic exploded view of a portion of an electronic device according to another embodiment of the present invention.

Referring now to FIG. 4, in another embodiment, similar to the embodiment described above with respect to FIG. 3 the temperature sensing semiconductor substrate 31" is carried over both the hot or heat desorbing and cold or heat absorbing semiconductor junctions 42", 41", and there is no dielectric layer between the temperature sensing semiconductor substrate and the cooling semiconductor substrate 38" upon integration.

The cooling semiconductor substrate 38" includes a cavity 46" therein at the upper surface 45" thereof. The cavity 46" is beneath and aligned with the hot junctions of the thermopile 32". The temperature sensing semiconductor substrate 31" does not include a cavity, and as a result may be thinner than the cooling semiconductor substrate 38". Thus, the overall electronic device 30" may be thinner.

Figure 5:
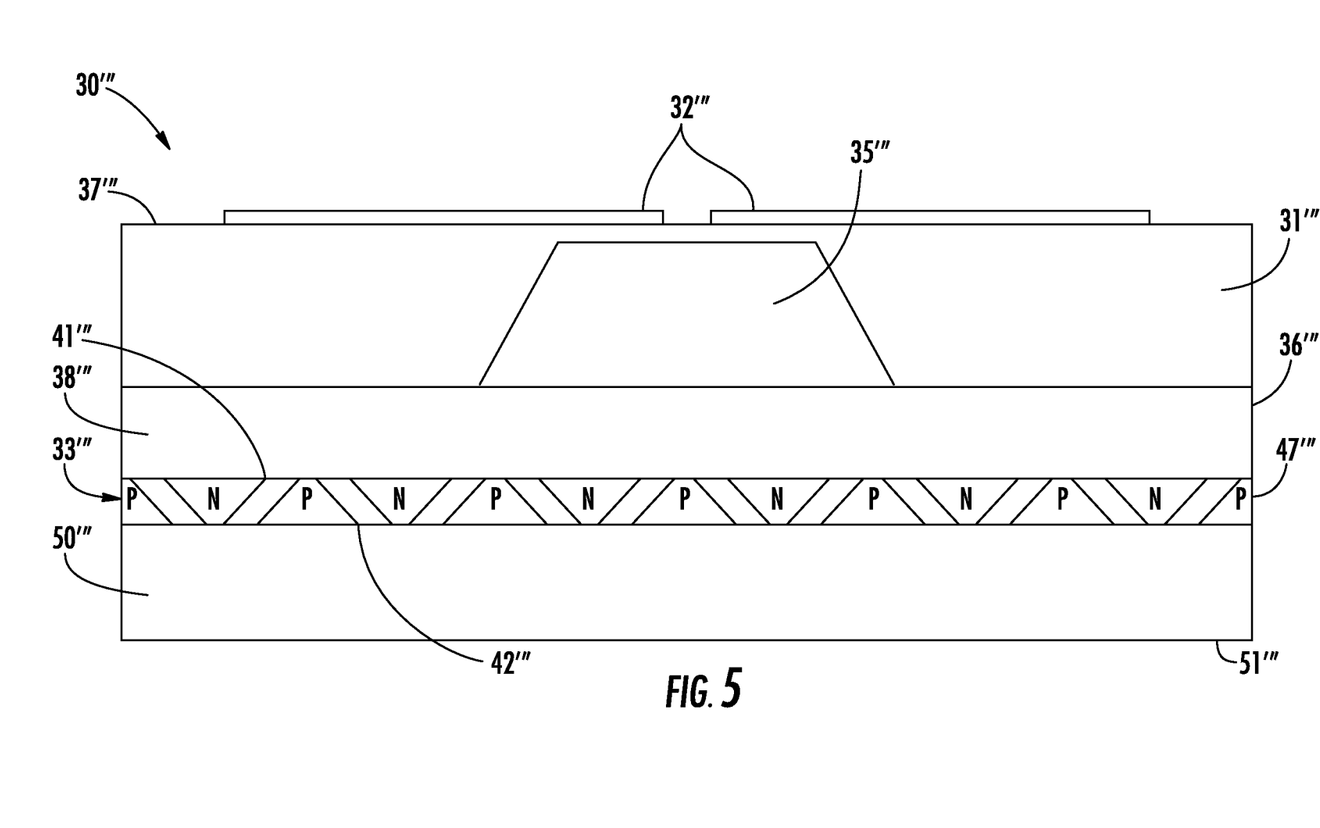
FIG. 5 is a side schematic view of a portion of an electronic device according to yet another embodiment of the present invention.

Referring now to FIG. 5, in yet another embodiment, the Peltier cooler 33''' includes cold semiconductor junctions 41''' and hot semiconductor junctions 42''' adjacent the lower surface 47''' of the cooling semiconductor substrate 38''' or the upper surface of another semiconductor substrate 50'''. The temperature sensing semiconductor substrate 31''' is carried over both the hot and cold semiconductor junctions 42''', 41'''. There is no dielectric layer between the temperature sensing semiconductor substrate 31''' and the cooling semiconductor substrate 38'''.

Additionally, the temperature sensing semiconductor substrate 31''' includes a cavity 35''' therein at the bottom surface 36''' thereof. The cavity 35''' is beneath and aligned with the hot junctions of the thermopile 32'''. The cooling semiconductor substrate 38''' does not include a cavity. Another semiconductor substrate 50''' is adjacent the lower surface 47''' of the cooling semiconductor substrate 38'''. Heat is extracted from adjacent the temperature sensing substrate 31''' and expelled toward a bottom surface 51''' of the other semiconductor substrate 50'''.

Figure 6:
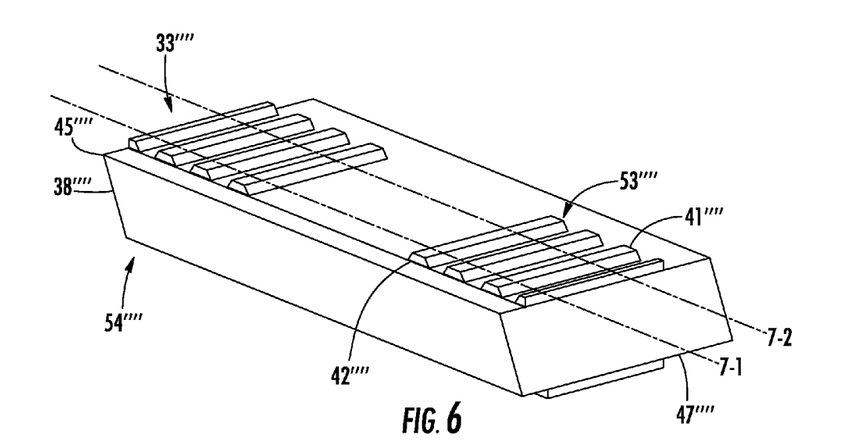
FIG. 6 is a schematic perspective view of a cooling semiconductor substrate of an electronic device according to yet another embodiment of the present invention.
Figure 7A:
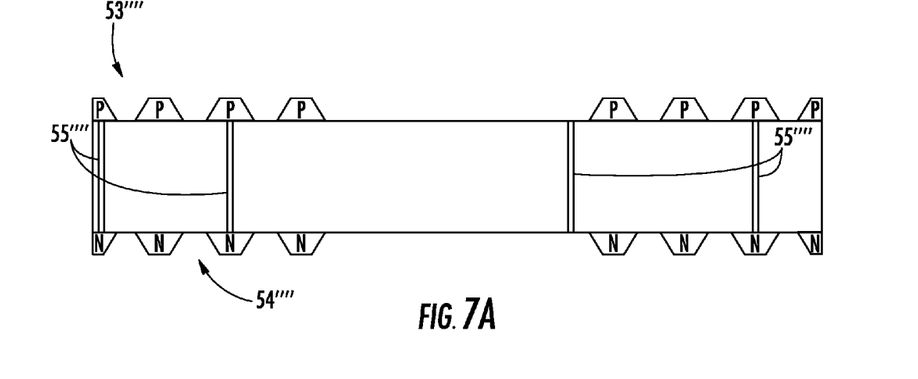
FIG. 7a is a schematic cross-sectional view of the cooling semiconductor substrate of FIG. 6 taken along 7-1.
Figure 7B:
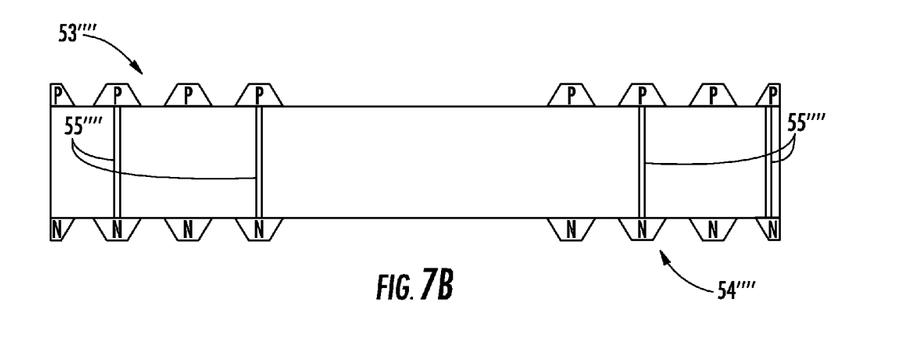
FIG. 7b is a schematic cross-sectional view of the cooling semiconductor substrate of FIG. 6 taken along 7-2.
Figure 8:
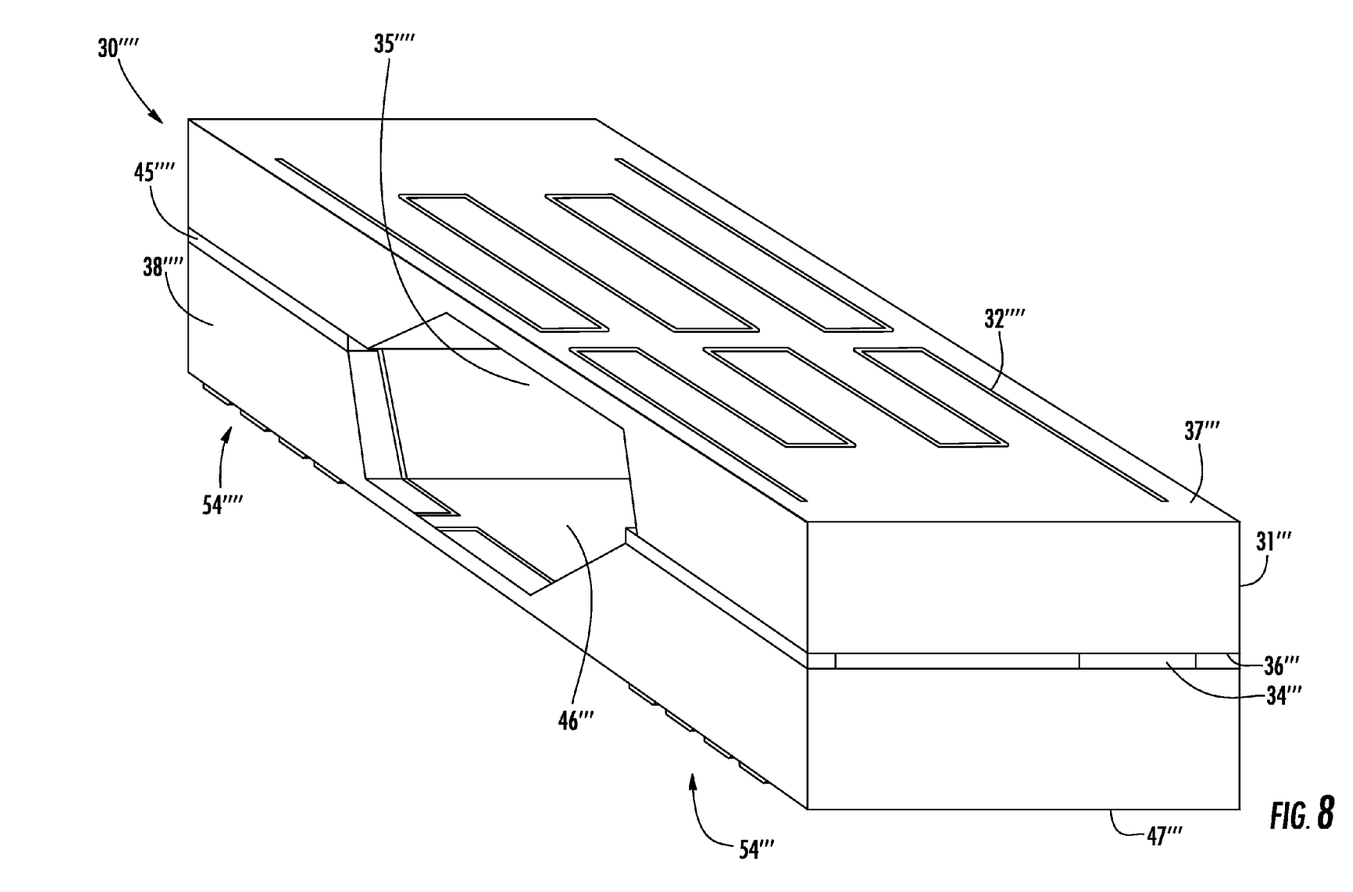
FIG. 8 is schematic perspective view of further portions of the electronic device of FIG. 6 with a cavity including the temperature sensing substrate.

Referring now to FIGS. 6-8, in yet another embodiment, the Peltier cooler 33'''' includes upper and lower sets of Peltier cooling elements 53'''', 54'''' on respective upper and lower surfaces 45'''', 47'''' of the cooling semiconductor substrate 38''''. More particularly, the upper set of Peltier cooling elements 53'''' may include P-type silicon P, and the lower set of Peltier cooling elements 54'''' may be N-type silicon N (FIGS. 7a and 7b). Of course, in other embodiments, the upper and lower sets of Peltier cooling elements 53'''', 54'''' may be arranged in another configuration, as will be appreciated by those skilled in the art.

Vias 55'''', for example, through-silicon vias (TSVs) extend through the cooling semiconductor substrate 38'''' and couple, respectively, the upper and lower sets of Peltier cooling elements 53'''', 54''''. The temperature sensing semiconductor substrate 31'''' is carried on the upper set of Peltier cooling elements 53''''. A dielectric layer 34'''' is between the temperature sensing semiconductor substrate 31'''' and the cooling semiconductor substrate 38''''. Additionally, both the temperature sensing semiconductor substrate 31'''' and the cooling semiconductor substrate 38'''' include respective cavities 35'''', 46'''' therein at the bottom surface 36'''' and the top surface 45'''' thereof, respectively. The cavities 35'''', 46'''' are beneath and aligned with the hot junctions of the thermopile 32''''.

Figure 9:
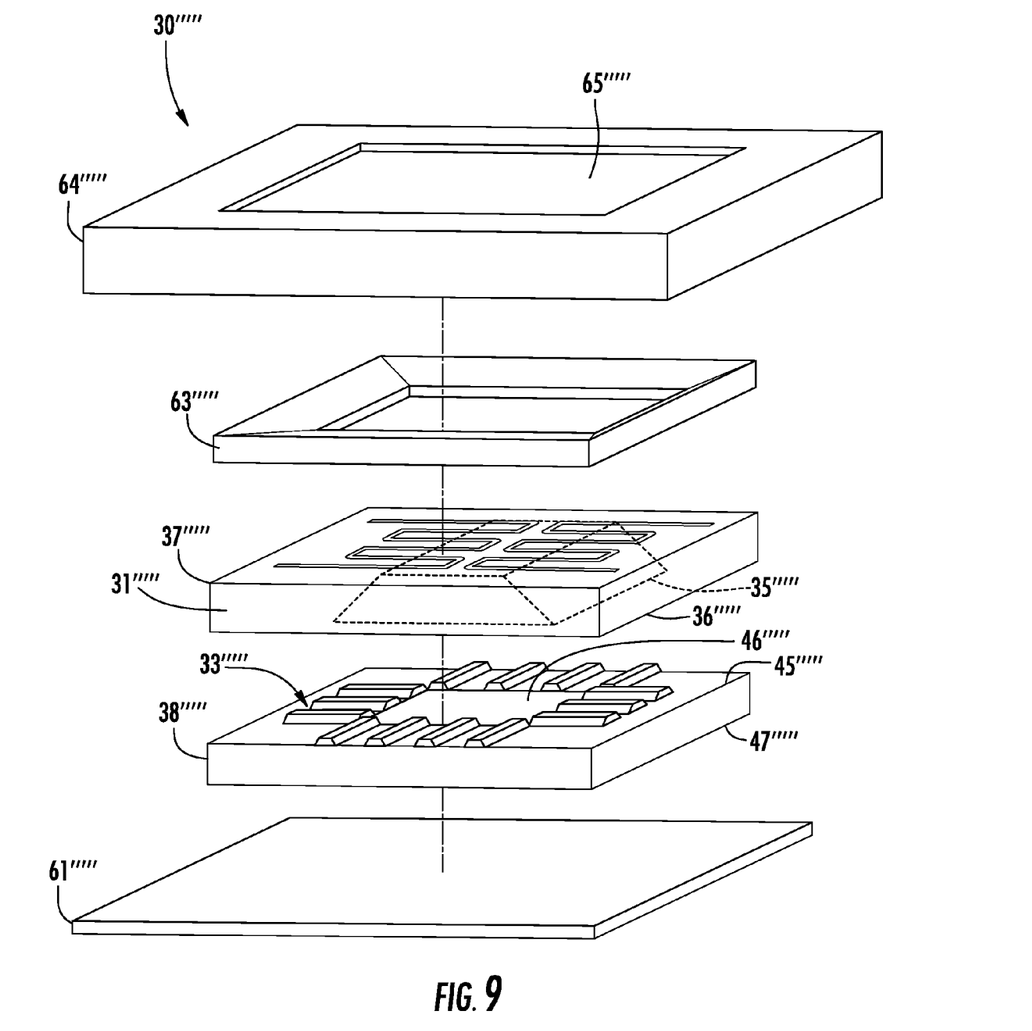
FIG. 9 is a schematic exploded view of yet another embodiment of an electronic device according to the present invention including packaging with a window and aligned IR filter.

Referring now to FIG. 9, in another embodiment the electronic device 30''''' may be an IR sensor, for example, and may include a heat sink 61 thermally coupled to the cooling semiconductor substrate 38'''''. More particularly, the heat sink 61''''' is coupled to the bottom surface 47''''' of the cooling semiconductor substrate 38'''''. The heat sink 61''''' may be in the form of a plate, for example, and may be metallic. Of course, the heat sink 61''''' may be another shape or material, for example. Of course, the heat sink 61''''' may be positioned on portions of the Peltier cooler 33''''' where it may be most desirable to expel heat.

The cooling semiconductor substrate 38''''' and the temperature sensing semiconductor substrate 31''''' are similar to those described above. In particular, the temperature sensing semiconductor substrate 31''''' includes a thermopile 32''''' at the upper surface 37''''' thereof, and the cooling semiconductor substrate 38''''' is coupled to the lower surface of the temperature sensing semiconductor substrate and includes a Peltier cooler 33'''''. The cooling semiconductor substrate 38''''' has a cavity 46''''' therein at the upper surface 45'''''. The temperature sensing semiconductor substrate 31''''' also has a cavity 35''''' therein at the bottom surface 36'''''. An IR filter 63''''' is positioned over the temperature sensing semiconductor substrate 31''''' aligned with the thermopile 32''''', or, in other embodiments, with the hot junctions of the thermopile. A package 64''''' surrounds the temperature sensing semiconductor substrate 31''''' and the cooling semiconductor substrate 38'''''. The package 64''''' has a window opening 65''''' therein receiving the IR filter 63'''''. In other words, through a combination of the IR filter 63''''', which is coupled within the window opening 65''''', IR may pass through the IR filter to the thermopile 32'''''. Additionally, the heat sink 61''''' may be particularly advantageous for increasingly expelling heat from within the package 64'''''.

In some embodiments, the thermopile 32 and the Peltier cooler 33 may define a pixel. An electronic device, which may be particularly useful for thermal imaging purposes, for example, may include one or more arrays of the pixels. Of course, the pixel may be defined by any design combination of a thermopile and a Peltier cooler.

As will be appreciated by those skilled in the art, the electronic device 30 may be particularly advantageous for improving sensitivity of thermopile-based passive infrared sensors to thus improve response times to, for example, match performance of microbolometers. Improved sensitivity may also compensate for a relatively low thermoelectric electromotive force (EMF) and may stabilize the cold junction temperature of thermopiles to reduce fluctuations, thereby reducing noise. The electronic device 30 may also harness the thermoelectric EMF generated at the two junctions of the two dissimilar metal layers and use it to power the Peltier cooler 33 thereby making a more robust device with relatively low power consumption. Self-heating, for example, at the substrate or at the wafer level packaging may also be advantageously reduced by transferring heat from inside the sensor or package 64''''' to outside the sensor.

As will be further appreciated by those skilled in the art, the ability to control the temperature of the cold junction may be particularly advantageous for providing lower noise, reduced false alarms, and the ability to improve the versatility of the sensor. More particularly, depending on the ambient temperature, measured by an on-board temperature sensor, for example, the thermopile 32, the cold junction temperature may be lowered or raised to maintain an expected signal output, which in IR sensors, is the temperature difference between the hot and cold junctions. The inclusion of integrated electronics for signal processing may also give rise to self-heating which may be addressed by the Peltier cooler 33.

A method aspect is directed to method of making an electronic device 30. The method includes forming a temperature sensing semiconductor substrate 31 that includes a thermopile 32 at an upper surface 37 thereof. The method may also include forming a cooling semiconductor substrate 38 that includes a Peltier cooler 33, and coupling an upper surface of the cooling semiconductor substrate 38 to a lower surface 36 of the temperature sensing semiconductor substrate 31. The method further includes forming a cavity 35, 46 in at least one of the temperature sensing semiconductor substrate 31 and the cooling semiconductor substrate 38 beneath the thermopile 32 and aligned therewith.

Figure 10:
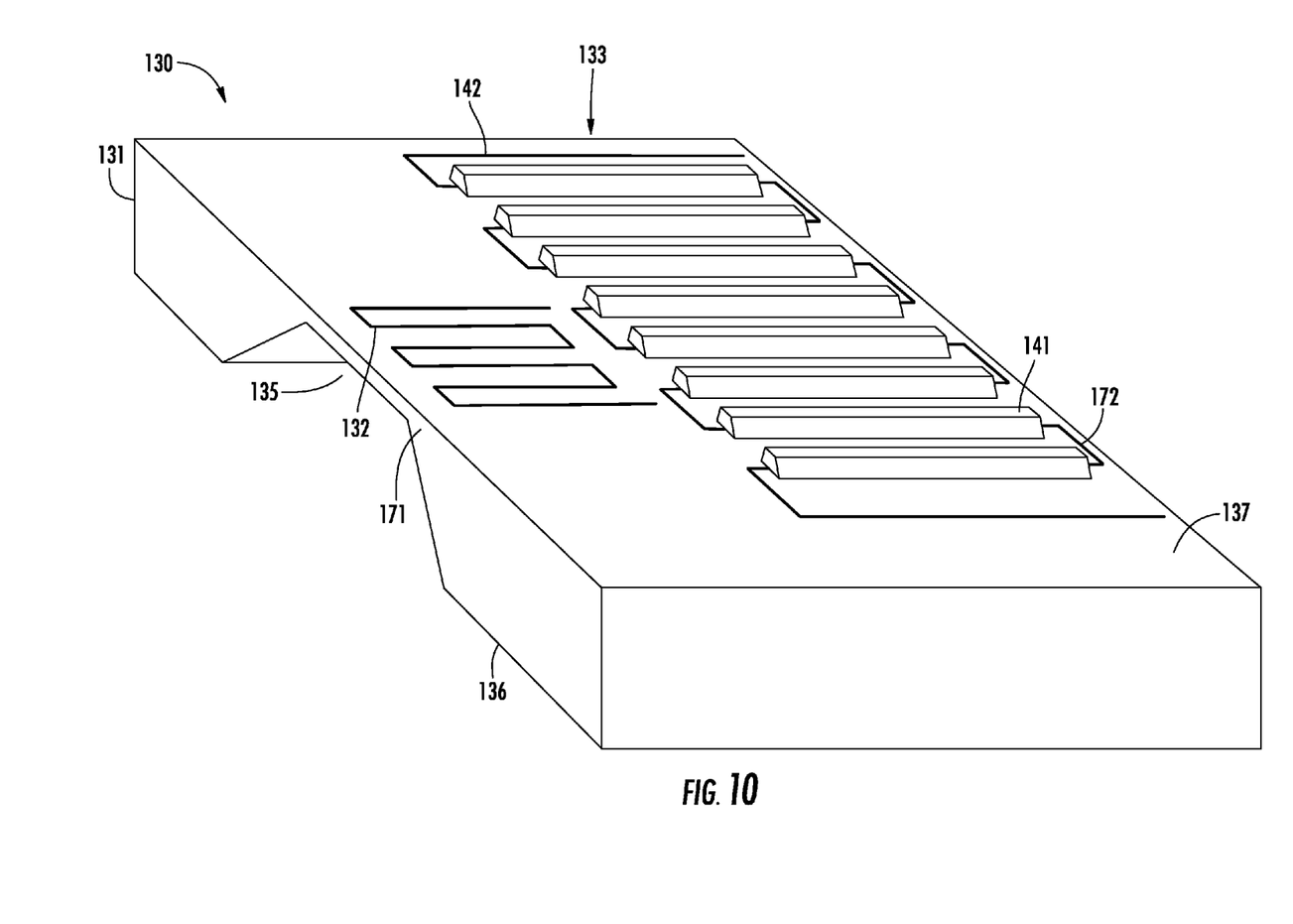
FIG. 10 is a schematic perspective view of a portion of an electronic device in accordance with an embodiment of the present invention.

Referring now to FIG. 10, an electronic device 130 includes a semiconductor substrate 131. The semiconductor substrate 131 includes a thermal sensor 132 in the form of a thermopile and a Peltier cooler 133 at an upper surface 137 thereof. More particularly, the thermopile 132 and the Peltier cooler 133 are on opposing sides or edges of the semiconductor substrate 131. The thermopile 132 is adjacent an edge 171 of the semiconductor substrate 131. As noted above, while the thermal sensor is described as being in the form of a thermopile, the thermal sensor may alternatively or additionally be in the form of a pyroelectric detector and a microbolometer.

The Peltier cooler 133 includes a cold semiconductor junctions 142 adjacent the thermopile 132. The Peltier cooler also includes hot semiconductor junctions 141 opposing the cold semiconductor junctions 142 adjacent another edge 172 of the semiconductor substrate 131. The semiconductor substrate 131 has a cavity 135 in a bottom or lower surface 136 thereof beneath the thermopile 132 and aligned therewith.

Figure 11:
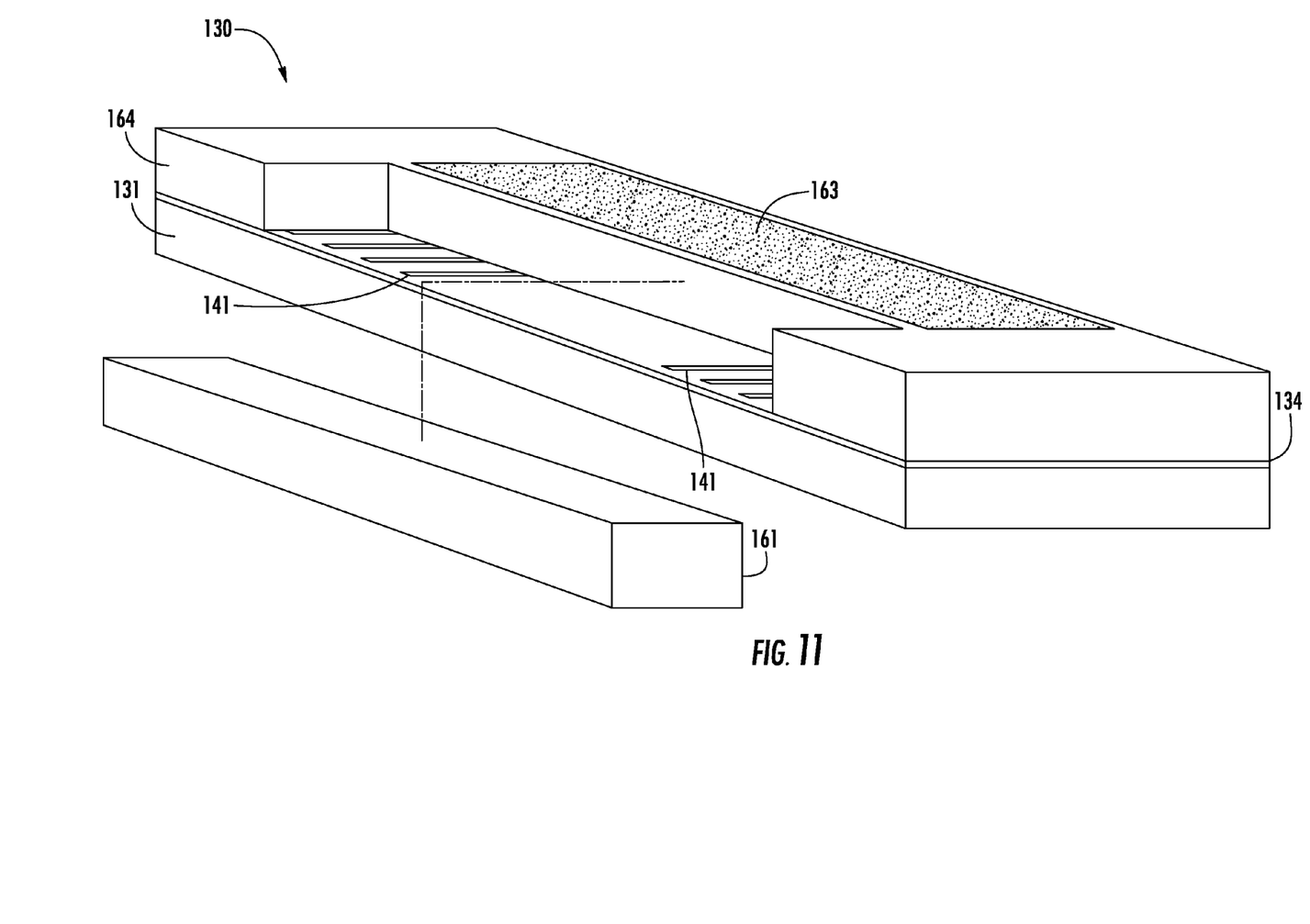
FIG. 11 is a schematic perspective view of the electronic device of FIG. 3 including further portions.
Figure 12:
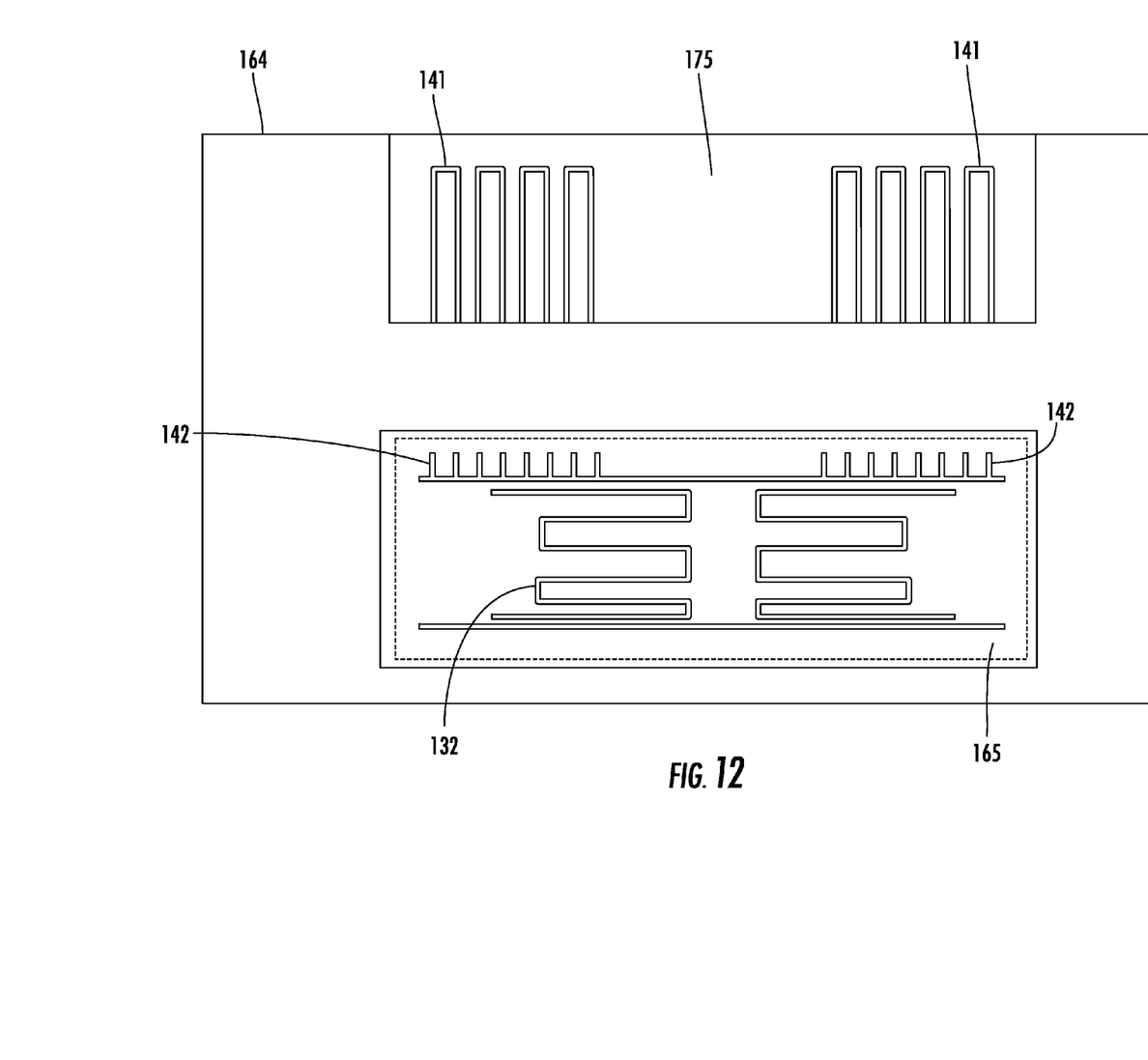
FIG. 12 is a schematic top view of the electronic device of FIG. 11.

Referring now additionally to FIGS. 11-12, the electronic device 130 also includes an infrared (IR) filter 163 aligned with the thermopile 132, or, in other embodiments, with the hot junctions of the thermopile. A package 164, for example, made of silicon, is over the semiconductor substrate 131 and has a window opening 165 therein receiving the IR filter 163. Such a wafer level package may be desirable in terms of cost efficiency, as will be appreciated by those skilled in the art. The package 164 also has an opening 175 therein aligned with the hot semiconductor junctions 141. The opening 175 being aligned with the hot semiconductor junctions 141 advantageously allows for increased heat dissipation.

Figure 13:
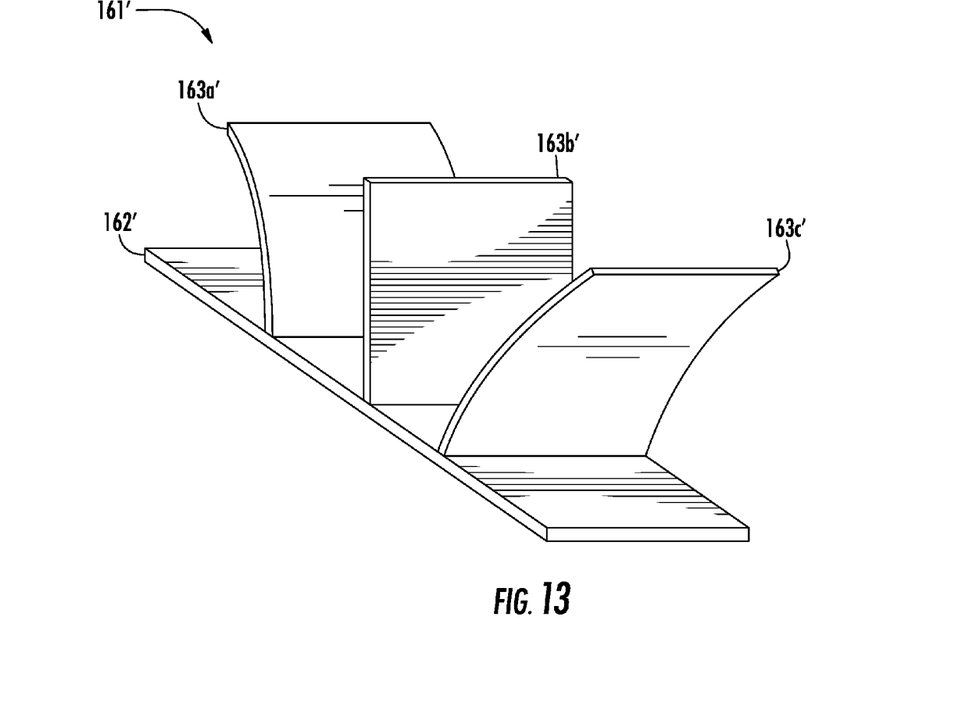
FIG. 13 is a perspective view of a heat sink for use with the electronic device according to the present invention.

The electronic device 130 also includes a dielectric layer 134 between the semiconductor substrate 131 and the package 164. A heat sink 161 may be received in the opening 175. The heat sink 161 is thermally coupled to the semiconductor substrate 131 for further heat dissipation, as will be appreciated by those skilled in the art. In some embodiments, a particularly advantageous configuration of the heat sink 161 may include a metallic base plate 162' with metallic plates 163a'-163c' extending outwardly from the base plate as illustrated in FIG. 13. Of course, the heat sink 161 may be configured differently, for example, based upon the configuration of the Peltier cooler 133 and the thermopile 132 on the semiconductor substrate 131.

A method aspect is directed to a method of making an electronic device 130. The method includes forming a semiconductor substrate 131 that includes a thermopile 132 and a Peltier cooler 133 at an upper surface 137 thereof. The Peltier cooler 133 includes cold semiconductor junctions 142 adjacent the thermopile 132, and hot semiconductor junctions 141. The method also includes aligning an IR filter 163 with the thermopile 132. The method further includes forming a package 164 over the semiconductor substrate 132 and has a window opening 165 therein receiving the IR filter 163. The package 164 also has an opening 175 therein aligned with the hot semiconductor junctions 141.

Indeed, while several embodiments of the electronic device have been described herein with respect to particular configurations, it should be understood that the elements of the different embodiments may be interchanged. In other words, elements, such as, for example, the heat sink 161' may be used with any of the other embodiments described herein.

Additionally, as noted above with respect to FIG. 1, for example, the cavities 35, 46 may define a fluid passageway through which fluid, for example, a coolant, may be passed for additional cooling. It should be understood that any cavity or cavities described in any of the embodiments herein may define a fluid passageway for further cooling.

any modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
   a temperature sensing semiconductor substrate comprising a thermal sensor at an upper surface thereof;
   a cooling semiconductor substrate having an upper surface coupled to a lower surface of said temperature sensing semiconductor substrate and comprising a Peltier cooler;
   said cooling semiconductor substrate having a cavity therein extending from the upper surface and beneath said thermal sensor and aligned therewith; and
   a dielectric layer between the temperature sensing semiconductor substrate and the cooling semiconductor substrate.

2. The electronic device according to claim 1, wherein said temperature sensing semiconductor substrate also has a cavity therein.

3. The electronic device according to claim 1, wherein said Peltier cooler comprises a plurality of cold semiconductor junctions and a plurality of hot semiconductor junctions at the upper surface of said cooling semiconductor substrate.

4. The electronic device according to claim 3, wherein said temperature sensing substrate is carried over said plurality of cold semiconductor junctions.

5. The electronic device according to claim 1, wherein said Peltier cooler comprises a plurality of cold semiconductor junctions and a plurality of hot semiconductor junctions at a lower surface of said cooling semiconductor substrate.

6. The electronic device according to claim 5, further comprising another semiconductor substrate adjacent the lower surface of said cooling semiconductor substrate.

7. The electronic device according to claim 1, wherein said Peltier cooler comprises upper and lower sets of Peltier cooling elements on respective upper and lower surfaces of said cooling semiconductor substrate, and a plurality of vias extending through said cooling semiconductor substrate and coupling respective ones of said upper and lower sets of Peltier cooling elements.

8. The electronic device according to claim 1, further comprising a heat sink thermally coupled to said cooling semiconductor substrate.

9. An electronic device comprising:
   a temperature sensing semiconductor substrate comprising a thermopile at an upper surface thereof;
   an infrared (IR) filter aligned with said thermopile;
   a cooling semiconductor substrate having an upper surface coupled to a lower surface of said temperature sensing semiconductor substrate and comprising a Peltier cooler;
   a dielectric layer between said temperature sensing semiconductor substrate and said cooling semiconductor substrate; and
   said cooling semiconductor substrate having a cavity therein extending from the upper surface and beneath said thermopile and aligned therewith.

10. The electronic device according to claim 9, wherein said temperature sensing semiconductor substrate also has a cavity therein.

11. The electronic device according to claim 9, wherein said Peltier cooler comprises a plurality of cold semiconductor junctions and a plurality of hot semiconductor junctions at the upper surface of said cooling semiconductor substrate.

12. The electronic device according to claim 11, wherein said temperature sensing substrate is carried over said plurality of cold semiconductor junctions.

13. The electronic device according to claim 9, wherein said Peltier cooler comprises a plurality of cold semiconductor junctions and a plurality of hot semiconductor junctions at a lower surface of said cooling semiconductor substrate.

14. The electronic device according to claim 13, further comprising another semiconductor substrate adjacent the lower surface of said cooling semiconductor substrate.

15. The electronic device according to claim 9, wherein said Peltier cooler comprises upper and lower sets of Peltier cooling elements on respective upper and lower surfaces of said cooling semiconductor substrate, and a plurality of vias extending through said cooling semiconductor substrate and coupling respective ones of said upper and lower sets of Peltier cooling elements.

16. The electronic device according to claim 9, further comprising a heat sink thermally coupled to said cooling semiconductor substrate.

17. The electronic device according to claim 9, further comprising a package surrounding said temperature sensing semiconductor substrate and said cooling semiconductor substrate, and having a window opening therein receiving said IR filter.

18. A method of making an electronic device comprising:
   forming a temperature sensing semiconductor substrate comprising a thermal sensor at an upper surface thereof;
   forming a cooling semiconductor substrate comprising a Peltier cooler;
   coupling an upper surface of the cooling semiconductor substrate to a lower surface of the temperature sensing semiconductor substrate;

forming a cavity in the cooling semiconductor substrate that extends from the upper surface and beneath the thermal sensor and aligned therewith; and forming a dielectric layer between the temperature sensing semiconductor substrate and the cooling semiconductor substrate.

19. The method according to claim 18, wherein another cavity is formed in the temperature sensing semiconductor substrate.

20. The method according to claim 18, wherein the Peltier cooler comprises a plurality of cold semiconductor junctions and a plurality of hot semiconductor junctions at the upper surface of the cooling semiconductor substrate.

21. The method according to claim 20, wherein the cooling semiconductor substrate is coupled to a lower surface of the temperature sensing semiconductor substrate so that the temperature sensing substrate is carried over the plurality of cold semiconductor junctions.

22. The method according to claim 18, wherein the Peltier cooler comprises a plurality of cold semiconductor junctions and a plurality of hot semiconductor junctions at a lower surface of the cooling semiconductor substrate.

23. The method according to claim 22, further comprising forming another semiconductor substrate adjacent the lower surface of the cooling semiconductor substrate.

24. The method according to claim 18, wherein the Peltier cooler comprises upper and lower sets of Peltier cooling elements on respective upper and lower surfaces of the cooling semiconductor substrate, and a plurality of vias extending through the cooling semiconductor substrate and coupling respective ones of the upper and lower sets of Peltier cooling elements.

25. The method according to claim 18, further comprising thermally coupling a heat sink to the cooling semiconductor substrate.

* * * * *